(12) United States Patent
Kopp et al.

(10) Patent No.: US 11,935,989 B2
(45) Date of Patent: Mar. 19, 2024

(54) OPTOELECTRONIC SEMICONDUCTOR CHIP AND METHOD FOR PRODUCING AN OPTOELECTRONIC SEMICONDUCTOR CHIP

(71) Applicant: OSRAM Opto Semiconductors GmbH, Regensburg (DE)

(72) Inventors: Fabian Kopp, Tanjung Tokong Penang (MY); Attila Molnar, Gelugor Penang (MY); Roland Heinrich Enzmann, Gelugor Penang (MY)

(73) Assignee: OSRAM Opto Semiconductors GmbH, Regensburg (DE)

( * ) Notice: Subject to any disclaimer, the term of this patent is extended or adjusted under 35 U.S.C. 154(b) by 141 days.

(21) Appl. No.: 17/611,189

(22) PCT Filed: May 15, 2020

(86) PCT No.: PCT/EP2020/063634
§ 371 (c)(1),
(2) Date: Nov. 15, 2021

(87) PCT Pub. No.: WO2020/234163
PCT Pub. Date: Nov. 26, 2020

(65) Prior Publication Data
US 2022/0310882 A1 Sep. 29, 2022

(30) Foreign Application Priority Data
May 17, 2019 (DE) ............... 10 2019 113 119.7

(51) Int. Cl.
*H01L 33/38* (2010.01)
*H01L 31/0224* (2006.01)
(Continued)

(52) U.S. Cl.
CPC .... *H01L 33/387* (2013.01); *H01L 31/022408* (2013.01); *H01L 31/1856* (2013.01);
(Continued)

(58) Field of Classification Search
CPC ... H01L 33/387; H01L 33/0062; H01L 33/42; H01L 33/62; H01L 33/0075; H01L 33/36;
(Continued)

(56) References Cited

U.S. PATENT DOCUMENTS

2004/0028875 A1* 2/2004 Van Rijn ............... B29C 41/38
264/299
2016/0064611 A1* 3/2016 Choi ..................... H01L 33/405
257/98
(Continued)

FOREIGN PATENT DOCUMENTS

DE 102008053731 A1 5/2010
DE 102016101652 A1 8/2017
(Continued)

OTHER PUBLICATIONS

International Search Report issued for the corresponding International patent application No. PCT/EP2020/063634, dated Sep. 11, 2020, 2 pages (for informational purposes only).
(Continued)

*Primary Examiner* — Sitaramarao S Yechuri
(74) *Attorney, Agent, or Firm* — Viering, Jentschura & Partner mbB; Robert M Bilotta, Jr.

(57) ABSTRACT

An optoelectronic semiconductor chip may include a first region doped with a first dopant, a second region doped with a second dopant, an active region between the first and second regions, a first contact layer having an electrically conductive material and covering the first region. An insulating layer may cover the first contact layer and include first openings, and the insulating layer may include a second
(Continued)

contact layer having an electrically conductive material and covering the insulating layer and the first openings. The first openings may completely penetrate the insulating layer, and the second contact layer may include second openings and/or a third contact layer comprising an electrically conductive material is arranged in the first openings in each case between the second contact layer and the insulating layer.

16 Claims, 11 Drawing Sheets

(51) Int. Cl.
*H01L 31/18* (2006.01)
*H01L 33/00* (2010.01)
*H01L 33/42* (2010.01)

(52) U.S. Cl.
CPC .......... *H01L 33/0062* (2013.01); *H01L 33/42* (2013.01); *H01L 2933/0016* (2013.01); *H01L 2933/0066* (2013.01)

(58) Field of Classification Search
CPC ......... H01L 31/022408; H01L 31/1856; H01L 31/02005; H01L 2933/0016; H01L 2933/0066; H01S 5/0421; H01S 5/0425
See application file for complete search history.

(56) References Cited

U.S. PATENT DOCUMENTS

| | | |
|---|---|---|
| 2017/0077353 A1 | 3/2017 | Kim et al. |
| 2019/0027666 A1 | 1/2019 | Scholz et al. |
| 2019/0067538 A1* | 2/2019 | Lee .................. H01L 33/62 |
| 2019/0103520 A1 | 4/2019 | Kopp et al. |
| 2019/0131497 A1 | 5/2019 | Höppel |
| 2019/0326471 A1 | 10/2019 | Kopp et al. |
| 2019/0371969 A1 | 12/2019 | Kopp et al. |
| 2020/0075811 A1 | 3/2020 | Molnar |
| 2020/0227588 A1 | 7/2020 | Kopp et al. |
| 2020/0295229 A1* | 9/2020 | Kim .................. H01L 33/10 |

FOREIGN PATENT DOCUMENTS

| | | |
|---|---|---|
| DE | 102016105056 A1 | 9/2017 |
| DE | 102016112587 A1 | 1/2018 |
| DE | 102016124847 A1 | 6/2018 |
| DE | 102017111123 A1 | 11/2018 |
| DE | 102017119881 A1 | 2/2019 |
| WO | 2017178427 A1 | 10/2017 |

OTHER PUBLICATIONS

German Search Report issued for the corresponding German patent application No. 10 2019 113 119.7, dated Aug. 7, 2019, 8 pages (for informational purposes only).

* cited by examiner

OPTOELECTRONIC SEMICONDUCTOR CHIP AND METHOD FOR PRODUCING AN OPTOELECTRONIC SEMICONDUCTOR CHIP

CROSS-REFERENCE TO RELATED APPLICATIONS

The present application is a national stage entry according to 35 U.S.C. § 371 of PCT application No.: PCT/EP2020/063634 filed on May 15, 2020; which claims priority to German Patent Application Serial No.: 10 2019 113 119.7 filed on May 17, 2019; all of which are incorporated herein by reference in their entirety and for all purposes.

TECHNICAL FIELD

An optoelectronic semiconductor chip and a method for producing an optoelectronic semiconductor chip are specified.

BACKGROUND

An object to be solved is to specify an optoelectronic semiconductor chip that can be operated efficiently. Another object to be solved is to specify a method for producing an optoelectronic semiconductor chip that can be operated efficiently.

SUMMARY

According to at least one embodiment of the optoelectronic semiconductor chip, the optoelectronic semiconductor chip comprises a first region doped with a first dopant. The first region may comprise one or more semiconductor layers. The first dopant may be a p-type dopant. The first region may be formed with a semiconductor material, such as a III-V compound semiconductor material. For example, the first region comprises GaN. The first region may be a three-dimensional body, which comprises, for example, at least approximately the shape of a cuboid or a cylinder. The main extension plane of the first region is parallel to one of the top surfaces of the cuboid or the cylinder.

According to at least one embodiment of the optoelectronic semiconductor chip, the optoelectronic semiconductor chip comprises a second region doped with a second dopant. The second region may comprise one or more semiconductor layers. The second dopant may be an n-type dopant. The second region may be formed with a semiconductor material, such as a III-V compound semiconductor material. For example, the second region comprises GaN. The second region may be a three-dimensional body, which comprises, for example, at least approximately the shape of a cuboid or a cylinder. The main extension plane of the second region is parallel to one of the top surfaces of the cuboid or the cylinder.

The first and second region may be arranged on a substrate. The substrate may comprise or consist of sapphire ($Al_2O_3$).

According to at least one embodiment of the optoelectronic semiconductor chip, the optoelectronic semiconductor chip comprises an active region between the first region and the second region. The active region is configured to emit and/or detect electromagnetic radiation during operation of the optoelectronic semiconductor chip. The active region may comprise at least one quantum well structure.

The semiconductor chip is, for example, a luminescent diode chip such as a light emitting diode chip or a laser diode chip or a photodiode.

According to at least one embodiment of the optoelectronic semiconductor chip, the optoelectronic semiconductor chip comprises a first contact layer comprising an electrically conductive material and covering the first region. In particular, the first contact layer completely covers the first region. The first contact layer is electrically conductive. Further, the first contact layer is at least in places in direct contact with the first region. The first contact layer may follow the first region in a growth direction. For example, the first contact layer comprises a TCO (transparent conductive oxide) material such as indium tin oxide.

According to at least one embodiment of the optoelectronic semiconductor chip, the optoelectronic semiconductor chip comprises an insulating layer covering the first contact layer and comprising first openings. The insulating layer comprises an electrically insulating material. The insulating layer is electrically insulating. For example, the insulating layer comprises silicon dioxide ($SiO_2$). The insulating layer may be arranged directly on the first region. It is further possible that the insulating layer is arranged spaced apart from the first region. The insulating layer comprises a plurality of first openings. The first openings may be trenches extending through the insulating layer. That is, in the region of the first openings, the insulating layer comprises interruptions. The first openings have the shape of a circle in plan view, for example. However, other shapes of the first openings are also possible.

According to at least one embodiment of the optoelectronic semiconductor chip, the optoelectronic semiconductor chip comprises a second contact layer comprising an electrically conductive material and covering the insulating layer and the first openings. The second contact layer is electrically conductive. Further, the second contact layer may be in direct contact with the insulating layer, at least in places. The second contact layer may follow in a growth direction of the insulating layer. For example, the second contact layer comprises indium tin oxide.

According to at least one embodiment of the optoelectronic semiconductor chip, the first openings completely penetrate the insulating layer. This may mean that in the first openings the layer arranged under the insulating layer is exposed. In the region of the first openings, the insulating layer is thus completely removed.

According to at least one embodiment of the optoelectronic semiconductor chip, the second contact layer comprises second openings and/or in the first openings a third contact layer comprising an electrically conductive material is arranged in each case between the second contact layer and the insulating layer. The second openings may be trenches which extend through the second contact layer. That is, in the region of the second openings, the second contact layer comprises interruptions. The second openings may extend completely through the second contact layer. That is, in the region of the second openings, the second contact layer is completely removed. In plan view, the second openings have the shape of a circle, for example. However, other shapes of the second openings are also possible. The second openings can be arranged at a distance from the first openings in a lateral direction, wherein the lateral direction is parallel to a main extension plane of the first region.

The third contact layer is electrically conductive. Further, the third contact layer is at least in places in direct contact with the insulating layer. Furthermore, the third contact layer is at least in places in direct contact with the second contact layer. In the region of the first openings, the third contact layer may be in direct contact with the first contact layer in places. The third contact layer may partially or completely cover the first openings in each case. Between the first openings, the third contact layer is at least in places not arranged between the insulating layer and the second contact layer. That is, the third contact layer comprises interruptions between the first openings. Thus, the third contact layer comprises a plurality of subregions, each of which is arranged in a first opening and are not in direct contact with each other. The third contact layer may follow the insulating layer in the growth direction. In the growth direction, the third contact layer may comprise a greater thickness than the second contact layer. For example, the third contact layer comprises indium tin oxide.

According to at least one embodiment of the optoelectronic semiconductor chip, the optoelectronic semiconductor chip comprises a first region doped with a first dopant, a second region doped with a second dopant, an active region between the first region and the second region, a first contact layer comprising an electrically conductive material and covering the first region, an insulating layer covering the first contact layer and comprising first openings and a second contact layer comprising an electrically conductive material and covering the insulating layer and the first openings, wherein the first openings completely penetrate the insulating layer, and the second contact layer comprises second openings and/or a third contact layer comprising an electrically conductive material is arranged in the first openings respectively between the second contact layer and the insulating layer.

The optoelectronic semiconductor chip described here is based inter alia on the idea that the brightness of the optoelectronic semiconductor chip can be increased during operation by reducing the absorption in the semiconductor chip. The first contact layer, the second contact layer and the third contact layer may each comprise a transparent conductive oxide. These layers comprise increased transparency to radiation emitted from the active region with decreasing layer thickness. In order to efficiently impress current into the first region, however, the layer thickness of the first contact layer and the second contact layer cannot be reduced arbitrarily.

By introducing the second openings into the second contact layer, less overall material of the second contact layer is required. That is, the total volume of the second contact layer can be reduced. Thus, less radiation is absorbed in the second contact layer overall. Therefore, the brightness of the optoelectronic semiconductor chip can be increased during operation.

By arranging the third contact layer in the region of the first openings, the layer thickness of the second contact layer can be reduced. The layer thickness of the third contact layer can be selected such that it completely covers the first openings and thus establishes an electrical contact to the first contact layer. Thus, it is not necessary for the entire second contact layer to comprise a layer thickness with which the first openings can be completely covered. The layer thickness of the second contact layer can therefore be selected to be smaller. This reduces the absorption of radiation, which is emitted by the active region during operation, in the second contact layer. Thus, the brightness of the optoelectronic semiconductor chip can be increased during operation.

The brightness of the optoelectronic semiconductor chip in operation can be increased either by introducing the second openings or by using the third contact layer. The brightness of the optoelectronic semiconductor chip during operation can be further increased by combining both features, that is, by introducing the second openings and simultaneously using the third contact layer.

According to at least one embodiment of the optoelectronic semiconductor chip, the second openings penetrate the second contact layer completely in each case. That is, the second openings extend completely through the second contact layer. The second openings may extend through the second contact layer in a vertical direction, wherein the vertical direction is perpendicular to the main extension plane of the first region. In the region of the second openings, the insulating layer is free of the second contact layer. Since the second openings each completely penetrate the second contact layer, less material of the second contact layer is required overall for the optoelectronic semiconductor chip. Therefore, the absorption in the optoelectronic semiconductor chip is reduced and the brightness of the optoelectronic semiconductor chip is increased during operation.

According to at least one embodiment of the optoelectronic semiconductor chip, the first contact layer and/or the second contact layer and/or the third contact layer comprise a transparent conductive oxide. For example, the first contact layer and/or the second contact layer and/or the third contact layer comprise indium tin oxide or ZnO.

Advantageously, the transparent conductive oxide is at least partially transparent to radiation emitted in the active region. At the same time, the transparent conductive oxide comprises a high electrical conductivity so that charge carriers can be efficiently impressed into the first region.

According to at least one embodiment of the optoelectronic semiconductor chip, the first and second contact layer are formed by the same material. For example, the first and second contact layers are both formed by the same transparent conductive oxide, in particular indium tin oxide. Since the first and second contact layers are formed by the same material, the fabrication of the optoelectronic semiconductor chip is simplified. Furthermore, the contact resistance between the first and second contact layers is reduced.

According to at least one embodiment of the optoelectronic semiconductor chip, the first, the second, and the third contact layer are formed by the same material. For example, the first, the second and the third contact layer are formed by the same transparent conductive oxide, in particular indium tin oxide.

According to at least one embodiment of the optoelectronic semiconductor chip, the third contact layer completely covers the first openings in each case. The first openings may each comprise side walls and a bottom surface. The third contact layer may completely cover the side walls and the bottom surface of the first openings in each case. This enables reliable electrical contact between the second contact layer and the first contact layer. Thus, charge carriers can be efficiently impressed into the first region via the second contact layer and the first contact layer.

According to at least one embodiment of the optoelectronic semiconductor chip, the third contact layer covers in places an upper side of the insulating layer facing away from the first region. The third contact layer covers the upper side of the insulating layer in places in regions arranged adjacent to first openings. That is, the third contact layer can completely cover the side walls of the first openings and can cover the upper side of the insulating layer adjacent thereto in places. The third contact layer can further completely cover edges of the insulating layer in the region of the first openings. This ensures that the first openings are completely covered by the third contact layer. This enables reliable electrical contact between the second contact layer and the first contact layer.

According to at least one embodiment of the optoelectronic semiconductor chip, the third contact layer in the first openings is in direct contact with the first contact layer. The first contact layer may form the bottom surface in the first openings. The third contact layer may be directly applied to the bottom surface of the first openings. Thus, the third contact layer is in direct contact with the first contact layer in the region of the bottom surface of the first openings. Thus, a reliable electrical contact between the second contact layer and the first contact layer is advantageously achieved.

According to at least one embodiment of the optoelectronic semiconductor chip, a first opening is arranged in a lateral direction between two second openings. The lateral direction runs parallel to the main extension plane of the first region. In each case, a first opening is arranged in the lateral direction between two second openings in a plan view of the optoelectronic semiconductor chip. That is, along the lateral direction, the optoelectronic semiconductor chip comprises alternately a first opening and a second opening. This enables charge carriers to be impressed uniformly through the second contact layer via the first openings into the first region.

According to at least one embodiment of the optoelectronic semiconductor chip, at least two of the first openings are arranged along a lateral direction at lattice points of a one-dimensional lattice. That is, the first openings comprise equal distances from each other along the lateral direction. Due to the equal spacing of the first openings, charge carriers are more homogeneously impressed into the first region. This leads to a homogeneous directional characteristic of the optoelectronic semiconductor chip.

According to at least one embodiment of the optoelectronic semiconductor chip, at least two of the second openings are arranged along a lateral direction at lattice points of a one-dimensional lattice. That is, the second openings comprise equal distances from each other along the lateral direction. If one second opening is arranged in the middle between each two first openings along the lateral direction, the flow of charge carriers via the second contact layer into the first region is less affected. In this case, the second openings are arranged at positions where the current density in the second contact layer is low during operation of the semiconductor chip. Thus, the first region can be further efficiently supplied with charge carriers via the second contact layer and the absorption of radiation, which is emitted by the active region during operation, in the second contact layer is reduced.

According to at least one embodiment of the optoelectronic semiconductor chip, the first dopant is a p-type dopant and the second dopant is an n-type dopant. This is particularly advantageous if the first region and the second region comprise gallium nitride.

According to at least one embodiment of the optoelectronic semiconductor chip, the second contact layer comprises a layer thickness of at most 90 nm along a growth direction perpendicular to a main extension plane of the first region. In particular, when the third contact layer is arranged in the first openings, the layer thickness of the second contact layer may be at most 90 nm. With a layer thickness in this region, the first region can still be efficiently supplied with charge carriers via the second contact layer and, in addition, the absorption of radiation from the active region in the second contact layer is reduced.

According to at least one embodiment of the optoelectronic semiconductor chip, the third contact layer comprises a layer thickness of at least 50 nm along a growth direction perpendicular to a main extension plane of the first region. For example, the layer thickness of the third contact layer is at most 200 nm. With this layer thickness of the third contact layer, it is ensured that the third contact layer completely covers the first openings and thus establishes a reliable electrical contact between the second contact layer and the first contact layer.

A method for producing an optoelectronic semiconductor chip is further specified. The optoelectronic semiconductor chip is producible with a method described herein. In other words, all features disclosed for the optoelectronic semiconductor chip are also disclosed for the method for producing an optoelectronic semiconductor chip, and vice versa.

According to at least one embodiment of the method for producing an optoelectronic semiconductor chip, the method comprises a method step of providing a first region on a second region, wherein the first region is doped with a first dopant and the second region is doped with a second dopant and an active region is arranged between the first region and the second region. The first region may be grown on top of the second region.

According to at least one embodiment of the method for producing an optoelectronic semiconductor chip, the method comprises a method step of applying a first contact layer on the first region, wherein the first contact layer comprises an electrically conductive material. The first contact layer may be applied directly on the first region. An etch stop layer may be applied on the first contact layer. In particular, the etch stop layer may comprise or consist of $Al_2O_3$.

According to at least one embodiment of the method for producing an optoelectronic semiconductor chip, the method comprises a method step in which an insulating layer is applied. The insulating layer is applied on the first contact layer or on the etch stop layer.

According to at least one embodiment of the method for producing an optoelectronic semiconductor chip, the method comprises a method step wherein first openings are etched in the insulating layer, wherein the first openings completely penetrate the insulating layer. The first openings are dry or wet chemically etched. The first openings can be etched from an upper side of the insulating layer in the direction of the first contact layer. Thereby, the insulating layer is completely removed in the region of the first openings. Thus, the first openings extend from the upper side of the insulating layer to the first contact layer or to the etch stop layer. The etch stop layer may be removed in the region of the first openings.

According to at least one embodiment of the method for producing an optoelectronic semiconductor chip, the method comprises a method step wherein a second contact layer is applied on the insulating layer and the first openings, wherein the second contact layer comprises an electrically conductive material. The second contact layer may completely cover the first openings.

According to at least one embodiment of the method for producing an optoelectronic semiconductor chip, the method comprises a method step of etching second openings in the second contact layer and/or applying a third contact layer in the first openings prior to applying the second contact layer, wherein the third contact layer comprises an electrically conductive material. The second openings may be etched in the second contact layer such that the second openings completely penetrate the second contact layer. Thus, the second contact layer is etched from a side facing away from the insulating layer toward the insulating layer. The third contact layer may completely cover the first openings. The third contact layer can be applied directly to the insulating layer and the first contact layer in the region of the first openings.

An optoelectronic semiconductor chip fabricated in this way can be operated efficiently because the absorption in the optoelectronic semiconductor chip of the radiation emitted from the active region can be reduced. On one hand, the absorption in the second contact layer is reduced since it comprises the second openings. Alternatively or additionally, the absorption in the second contact layer is reduced, since the layer thickness of the second contact layer may be reduced when the third contact layer is arranged in the first openings. Thus, the brightness of the optoelectronic semiconductor chip is increased during operation.

According to at least one embodiment of the method for producing an optoelectronic semiconductor chip, an etch stop layer is applied on the first contact layer. The etch stop layer acts as an etch stop layer for the insulating layer for etching the first openings.

BRIEF DESCRIPTION OF THE DRAWINGS

Hereinafter, the optoelectronic semiconductor chip and the method for producing an optoelectronic semiconductor chip described herein will be explained in more detail in conjunction with exemplary embodiments and the accompanying figures.

With FIGS. 5A, 5B, 5C, 5D and 5E, an exemplary embodiment of the method for producing an optoelectronic semiconductor chip is described.

Identical elements, elements of the same kind or elements having the same effect are indicated in the figures with the same reference signs. The figures and the proportions of the elements shown in the figures with respect to one another are not to be regarded as to scale. Rather, individual elements may be shown exaggeratedly large for better representability and/or for better comprehensibility.

DETAILED DESCRIPTION

Figure 1A:
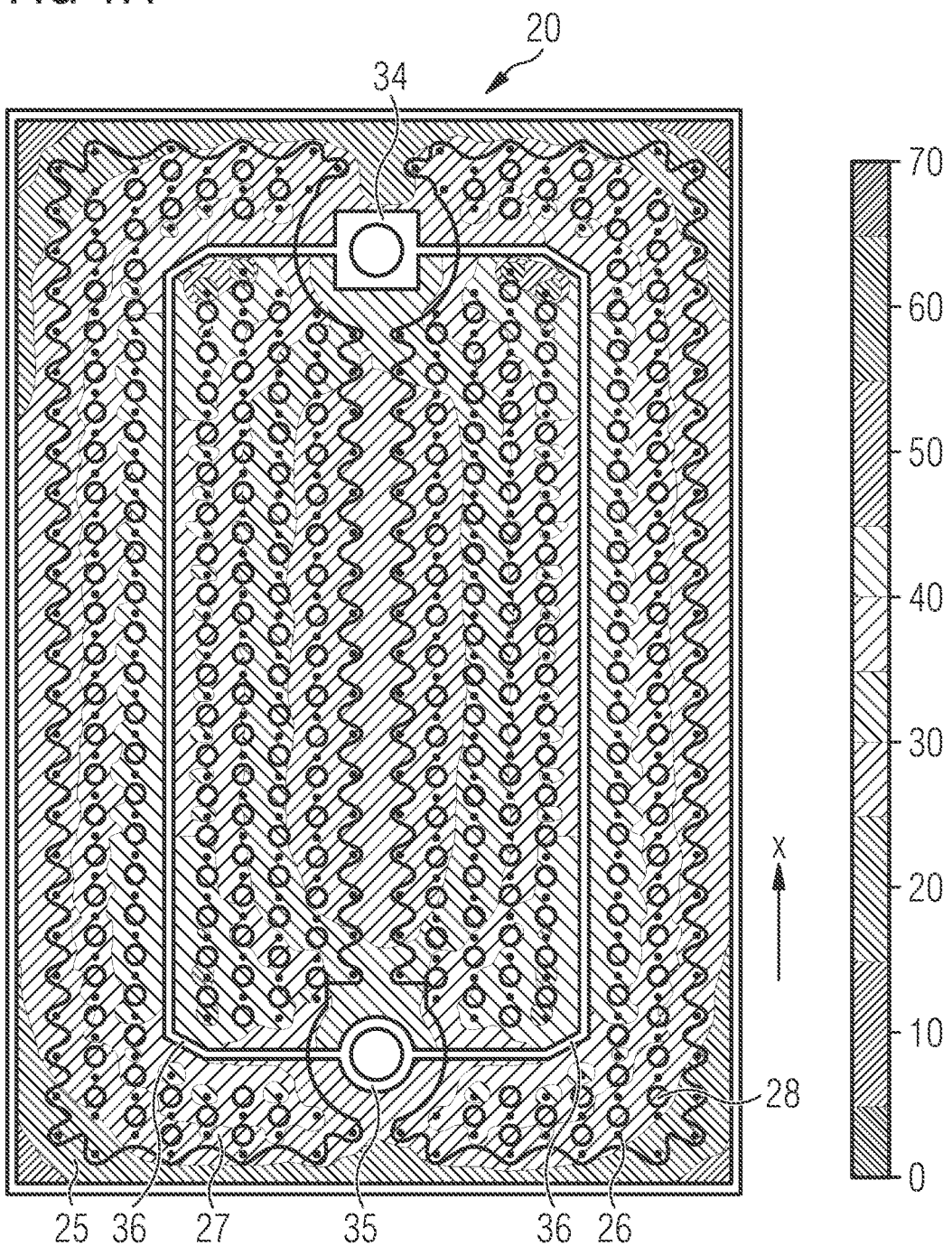
FIG. 1A shows a top view of an exemplary embodiment of an optoelectronic semiconductor chip.
Figure 1B:
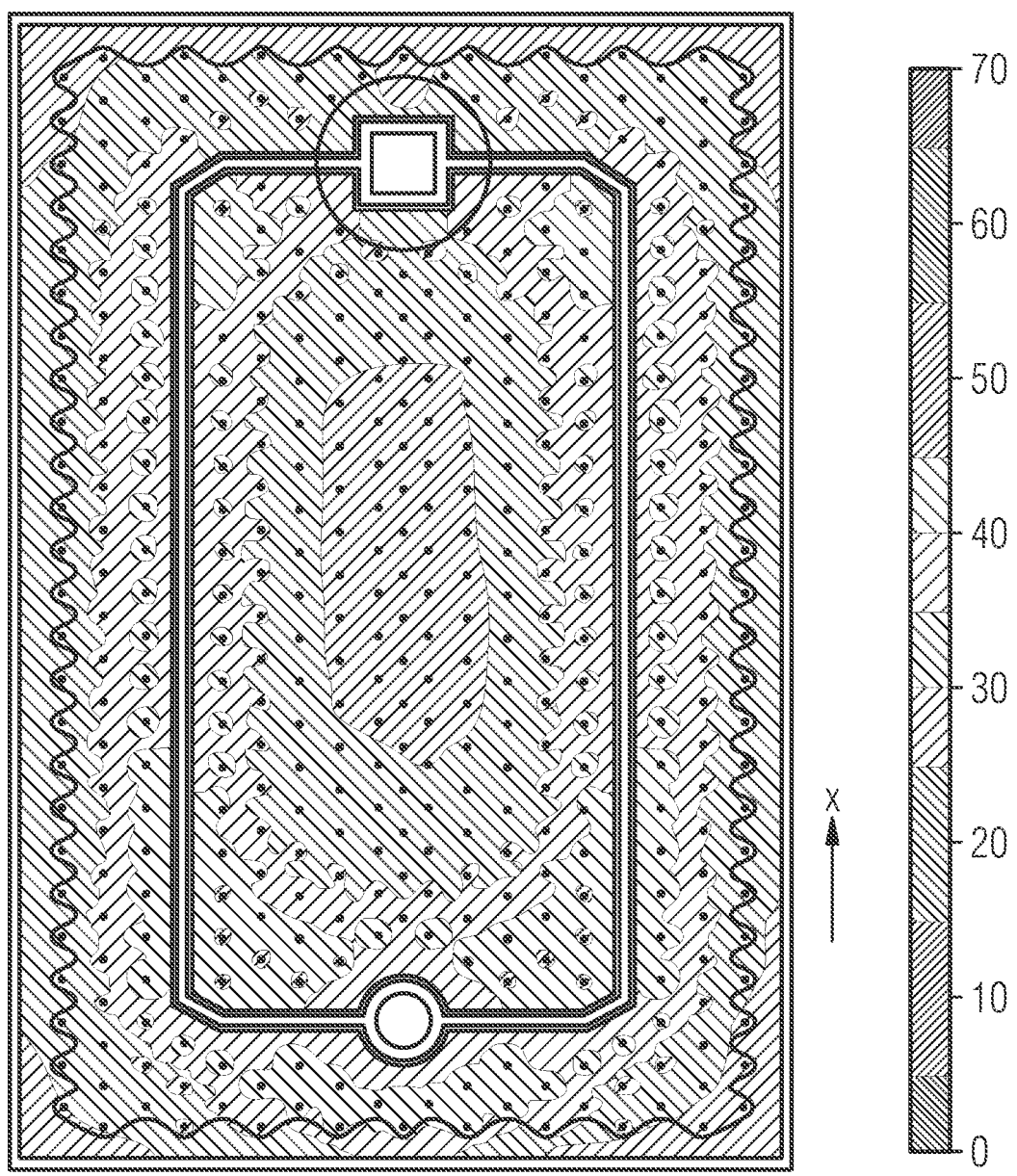
FIG. 1B shows a top view of an example of an optoelectronic semiconductor chip.

With FIGS. 1A and 1B, the current density distribution of an optoelectronic semiconductor chip 20 according to an exemplary embodiment is compared with an exemplary optoelectronic semiconductor chip. Thereby, the scale shown next to FIG. 1B applies to both figures.

In FIG. 1A, a top view of an exemplary embodiment of the optoelectronic semiconductor chip 20 is shown. The optoelectronic semiconductor chip 20 comprises a first contact 34 and a second contact 35. For example, the first contact 34 is an n-side contact and the second contact 35 is a p-side contact. The first contact 34 and the second contact 35 are each connected with a contact bridge 36. The contact bridge 36 comprises two contact areas arranged one above the other and electrically insulated from each other. These are each designed to supply power to different regions of the optoelectronic semiconductor chip 20.

The optoelectronic semiconductor chip 20 comprises a first region 21 which is doped with a first dopant, in this case a p-type dopant. Further, the optoelectronic semiconductor chip 20 comprises a second region 22 which is doped with a second dopant, in this case an n-type dopant. In the growth direction R, the first region 21 is arranged above the second region 22, wherein the growth direction is perpendicular to the main extension plane of the first region 21. A first contact layer 24 is arranged on the first region 21, which comprises an electrically conductive material. An insulating layer 25 is arranged on the first contact layer 24. The insulating layer 25 comprises first openings 26, which are shown as dots in FIG. 1A.

A second contact layer 27, which comprises an electrically conductive material, is arranged on the insulating layer 25 and in the first openings 26. The second contact layer 27 is electrically conductively connected with one of the contact areas of the contact bridge 36. Thus, the first region 21 can be supplied with charge carriers via the contact bridge 36, the second contact layer 27 and the first contact layer 24.

The second contact layer 27 comprises second openings 28. The second openings 28 are arranged spaced apart to the first openings 26. The first openings 26 and the second openings 28 are not necessarily in one plane, but are shown adjacent to each other in FIG. 1A. The second openings 28 comprise a circular cross-section.

The second contact layer 27 does not extend over the entire surface of the optoelectronic semiconductor chip 20, but only in the regions where first openings 26 are arranged. The first contact layer 24 and the second contact layer 27 each comprise indium tin oxide.

In a lateral direction x, which runs parallel to the main extension plane of the first region 21, a first opening 26 is arranged between two second openings 28 in each case. Thereby, the first openings 26 are arranged along a lateral direction x at lattice points of a one-dimensional lattice. Further, the second openings 28 are arranged along the lateral direction x at lattice points of a one-dimensional lattice. A plurality of these rows of first openings 26 and second openings 28 are arranged side by side.

FIG. 1A also shows a simulation of the current density distribution during operation of the semiconductor optoelectronic chip 20. The scale next to FIG. 1B specifies the current density in $A/cm^2$. The higher the current density, the higher the intensity of the radiation emitted by the optoelectronic semiconductor chip 20. The simulation shows that the current density is highest near the first openings 26 and near the first contact 34 and the second contact 35. With increasing distance to the contact bridges 36, the current density decreases.

For comparison, FIG. 1B shows a top view of an example optoelectronic semiconductor chip. Unlike the exemplary embodiment shown in FIG. 1A, the optoelectronic semiconductor chip in FIG. 1B does not comprise second openings 28. The current density distribution for the example shown in FIG. 1B is only slightly different from the current density distribution for the exemplary embodiment shown in FIG. 1A. Thus, a similar intensity of current can be impressed in both cases. Due to the second openings 28 in the second contact layer 27, the absorption in the optoelectronic semiconductor chip 20 of FIG. 1A is significantly reduced. For example, the area of the second contact layer 27 can be reduced by about 28%. This results in a significant reduction in the absorption of radiation in the second contact layer 27. Thus, the brightness in operation of the optoelectronic semiconductor chip 20 of FIG. 1A is significantly increased compared to the example of FIG. 1B.

Figure 2A:
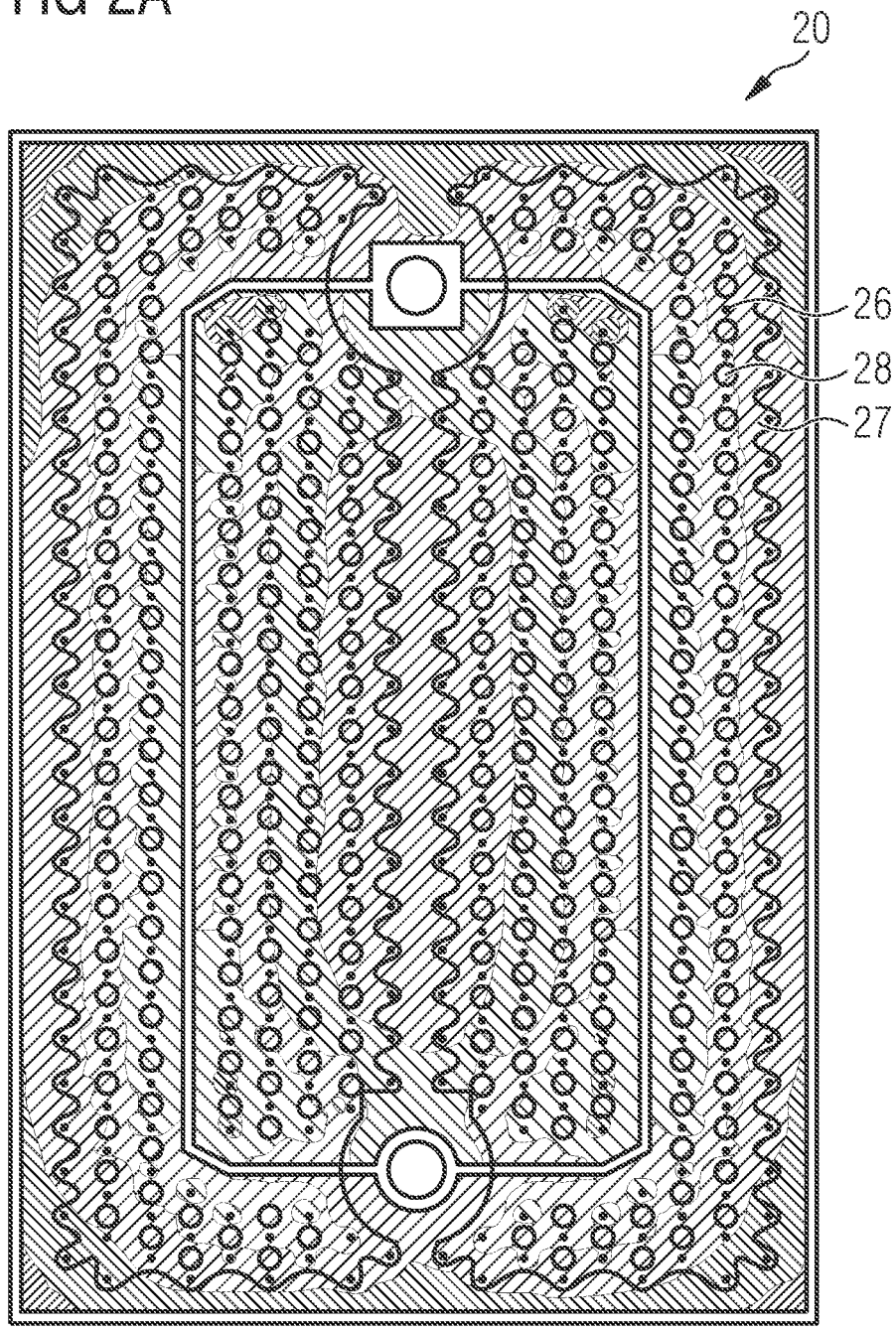
FIGS. 2A, 2B, 2C, 2D, and 2E show top views of exemplary embodiments of an optoelectronic semiconductor chip.

FIG. 2A shows a top view of an optoelectronic semiconductor chip 20 according to an exemplary embodiment. Thereby, as in FIG. 1A, the simulated current density distribution is shown. The optoelectronic semiconductor chip 20 comprises first openings 26 and second openings 28 which are distributed over the entire area of the second contact layer 27. The diameter of the second openings 28 is substantially larger than the diameter of the second openings 26.

Figure 2B:
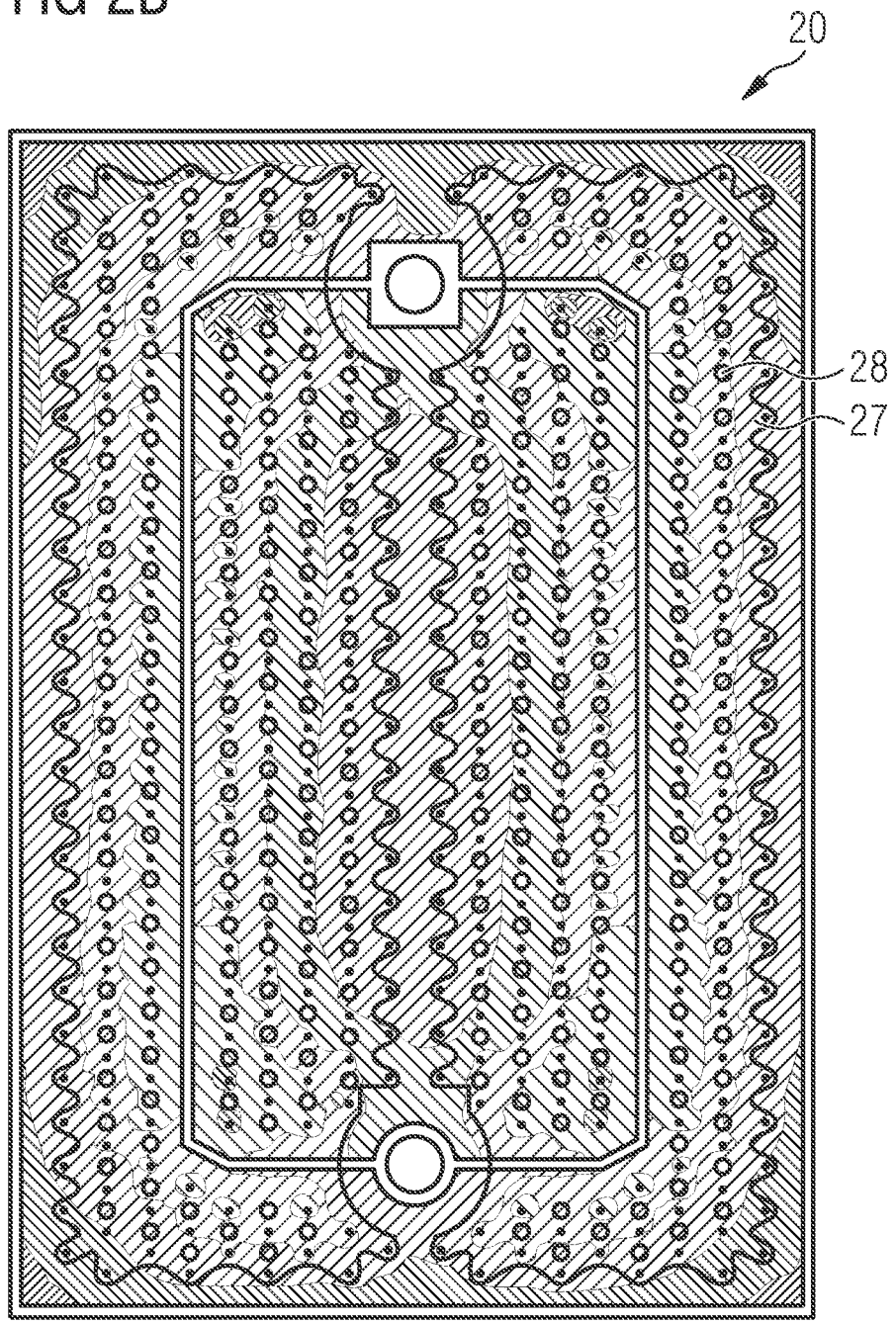

FIG. 2B shows a top view of an optoelectronic semiconductor chip 20 according to another exemplary embodiment. As in FIG. 1A, the simulated current density distribution is shown. Compared to the exemplary embodiment shown in FIG. 2A, the second openings 28 comprise a smaller diameter. The larger the diameter of the second openings 28, the more the forward voltage of the semiconductor optoelectronic chip 20 increases and the less radiation is absorbed in the second contact layer 27. Thus, the size of the second openings 28 can be adjusted to these two parameters. For the second openings 28 shown in FIG. 2B, which comprise a smaller diameter compared to FIG. 2A, forward voltage is increased less, but the absorption of the second contact layer 27 is larger than in the exemplary embodiment shown in FIG. 2A.

Figure 2C:
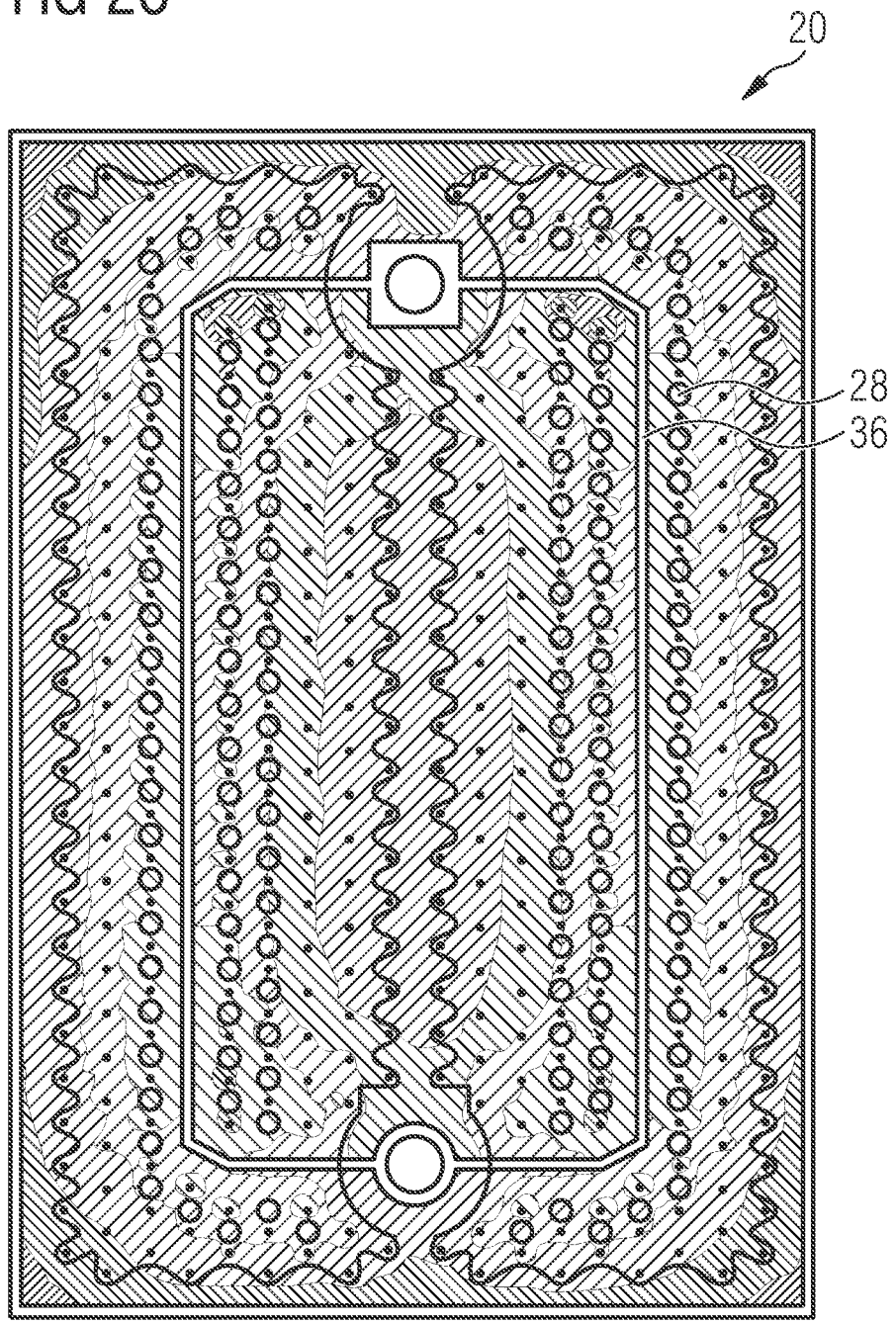

FIG. 2C shows a top view of an optoelectronic semiconductor chip 20 according to another exemplary embodiment. As in FIG. 1A, the simulated current density distribution is shown. Compared to the exemplary embodiment shown in FIG. 2A, the second openings 28 are arranged only in the vicinity of the contact bridges 36. This results in a more homogeneous current distribution. As a result, the radiation characteristic of the optoelectronic semiconductor chip 20 is also more homogeneous.

Figure 2D:
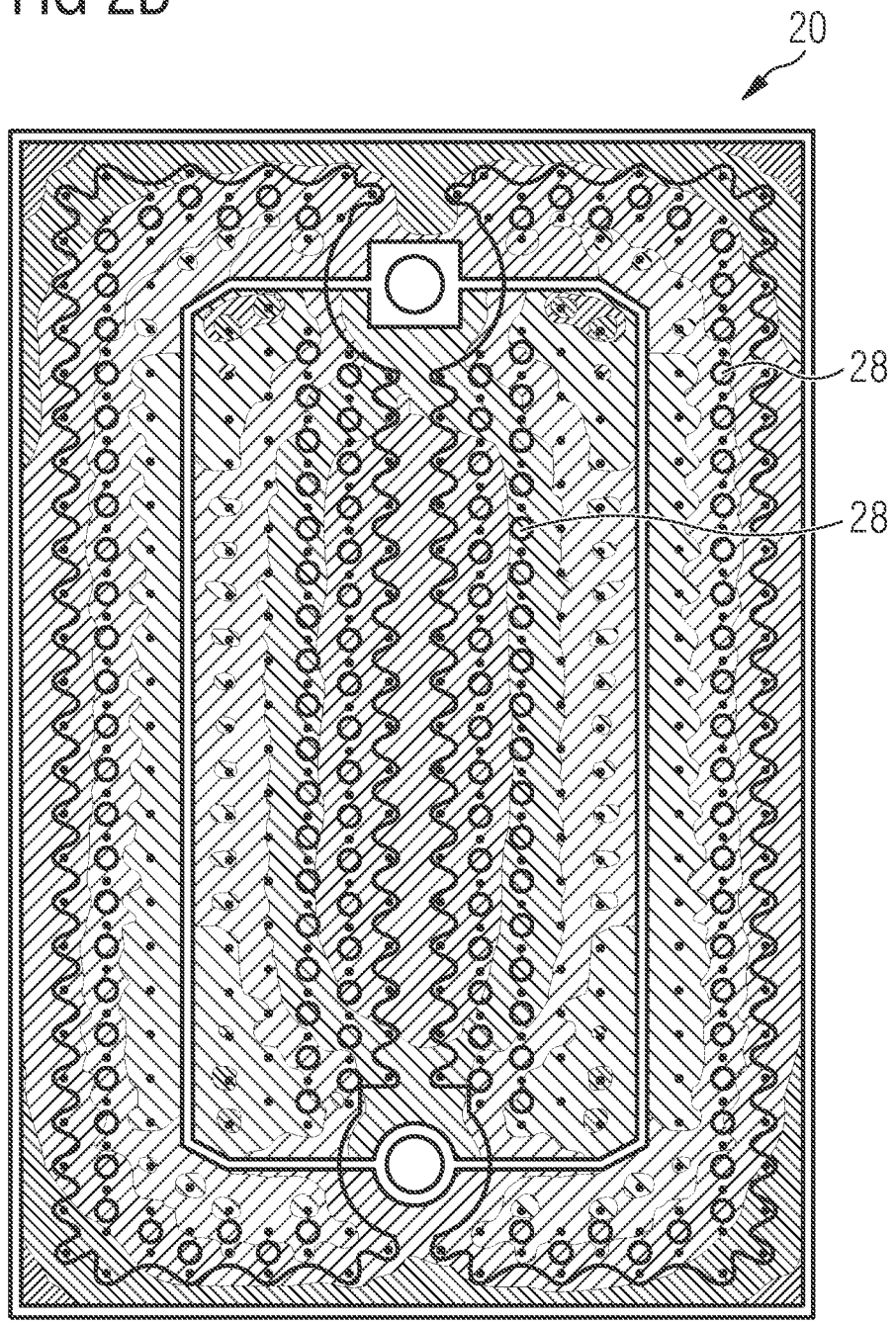

FIG. 2D shows a top view of an optoelectronic semiconductor chip 20 according to a further exemplary embodiment. As in FIG. 1A, the simulated current density distribution is shown. Compared to the exemplary embodiment shown in FIG. 2A, the second openings 28 are arranged only in the center and at the edge of the optoelectronic semiconductor chip 20. This also achieves a more homogeneous current distribution.

Figure 2E:
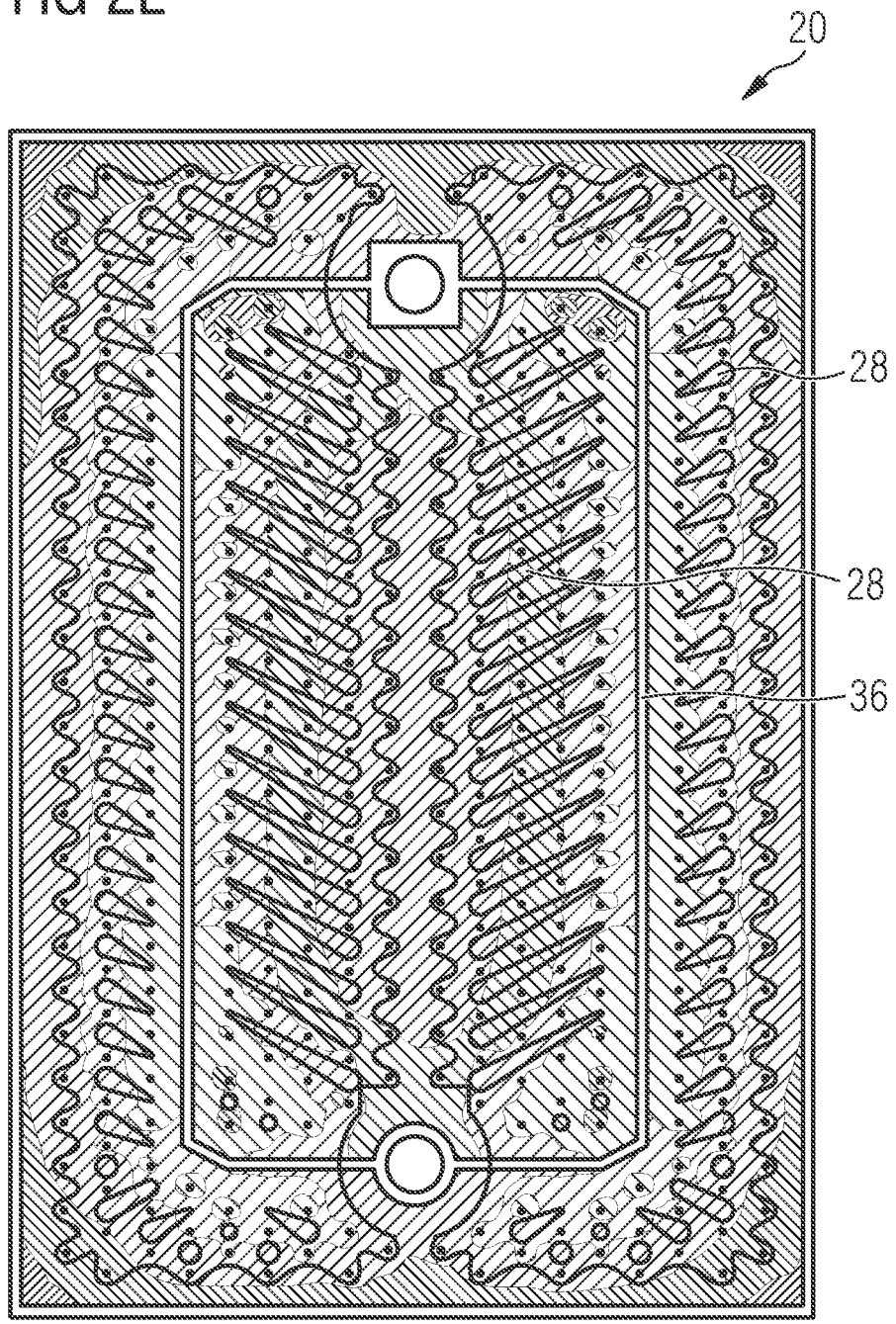

FIG. 2E shows a top view of an optoelectronic semiconductor chip 20 according to a further exemplary embodiment. As in FIG. 1A, the simulated current density distribution is shown. Compared to the exemplary embodiment shown in FIG. 2A, the optoelectronic semiconductor chip 20 comprises fewer second openings 28 overall. In addition, the second openings 28 do not comprise a circular cross-section but various elongated shapes. As a result, the current density and thus the intensity of the emitted radiation is higher in the region of the contact bridges 36 than in the center and at the edge of the optoelectronic semiconductor chip 20.

Figure 3A:
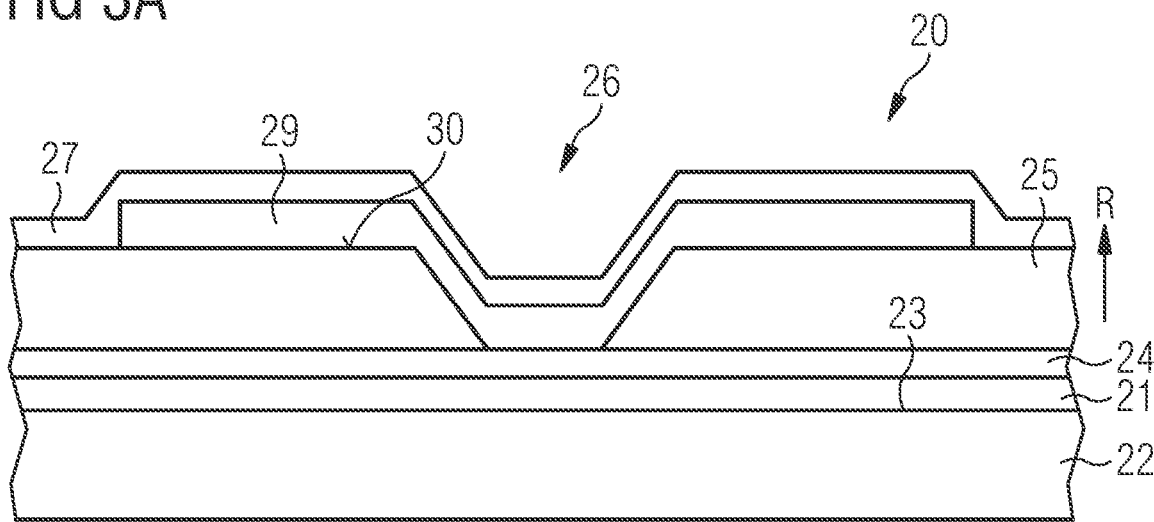
FIGS. 3A and 3B each show a schematic cross-sectional view of an optoelectronic semiconductor chip according to an exemplary embodiment.

FIG. 3A shows a cross-sectional view of the optoelectronic semiconductor chip 20 according to an exemplary embodiment. The first region 21 is arranged on the second region 22. An active region 23 for generating electromagnetic radiation is arranged between the first region 21 and the second region 22. The first contact layer 24 is arranged on and completely covers the first region 21. The insulating layer 25 is arranged on and covers the first contact layer 24. The insulating layer 25 comprises first openings 26. In FIG. 3A, a first opening 26 is shown as an example. The first opening 26 completely penetrates the insulating layer 25. In the first opening 26, a third contact layer 29 covers the insulating layer 25 and the first contact layer 24. Thus, the third contact layer 29 completely covers the first opening 26. Furthermore, the third contact layer 29 is in direct contact with the first contact layer 24 in the first opening 26. Further, the third contact layer 29 covers in places an upper side 30 of the insulating layer 25 facing away from the first region 21. The third contact layer 29 covers the upper side 30 of the insulating layer 25 directly adjacent the first opening 26. The third contact layer 29 comprises an electrically conductive material. For example, the first contact layer 24, the second contact layer 27, and the third contact layer 29 comprise indium tin oxide.

The second contact layer 27 covers the insulating layer 25 and the first openings 26. Thus, the second contact layer 27 also covers the third contact layer 29. This means that the third contact layer 29 is arranged in the first opening 26 between the second contact layer 27 and the insulating layer 25.

In a growth direction R, which is perpendicular to the main extension plane of the first region 21, the third contact layer 29 comprises a greater thickness than the second contact layer 27.

Figure 3B:
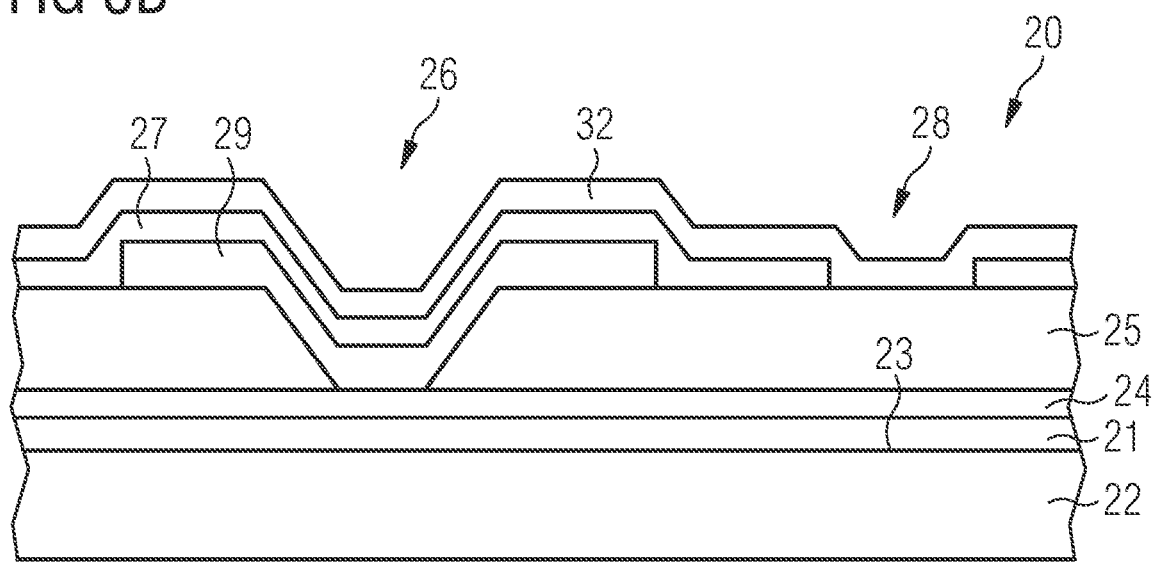

In FIG. 3B, a cross-sectional view of the optoelectronic semiconductor chip 20 according to another exemplary embodiment is shown. In contrast to the exemplary embodiment shown in FIG. 3A, the second contact layer 27 comprises second openings 28. In FIG. 3B, a second opening 28 is shown as an example. The second opening 28 is arranged in a lateral direction x spaced apart from the first opening 26. Furthermore, the second opening 28 completely penetrates the second contact layer 27. This means that the second opening 28 extends to the insulating layer 25 through the second contact layer 27. A passivation layer 32 is arranged on the second contact layer 27.

Figure 4A:
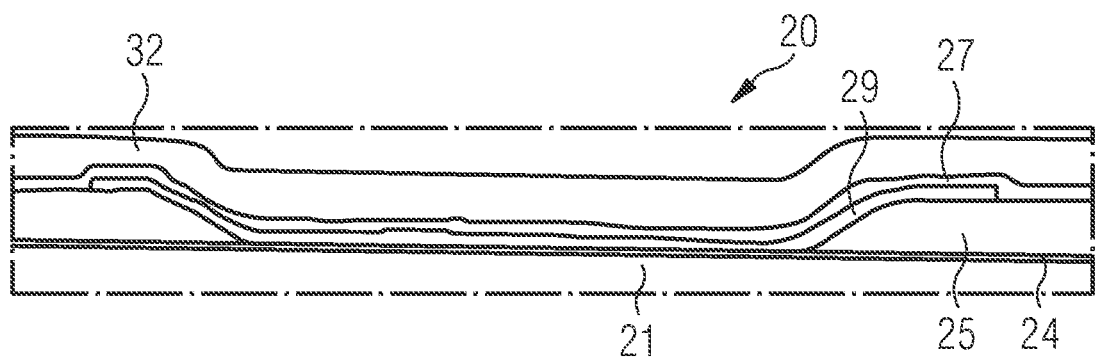
FIGS. 4A and 4B show a schematic cross-sectional view of an optoelectronic semiconductor chip according to an exemplary embodiment.

FIG. 4A shows a cross-sectional view of the optoelectronic semiconductor chip 20 according to another exemplary embodiment. The optoelectronic semiconductor chip 20 comprises the structure shown in FIG. 3A. In addition, a passivation layer 32 is arranged on the second contact layer 27.

Figure 4B:
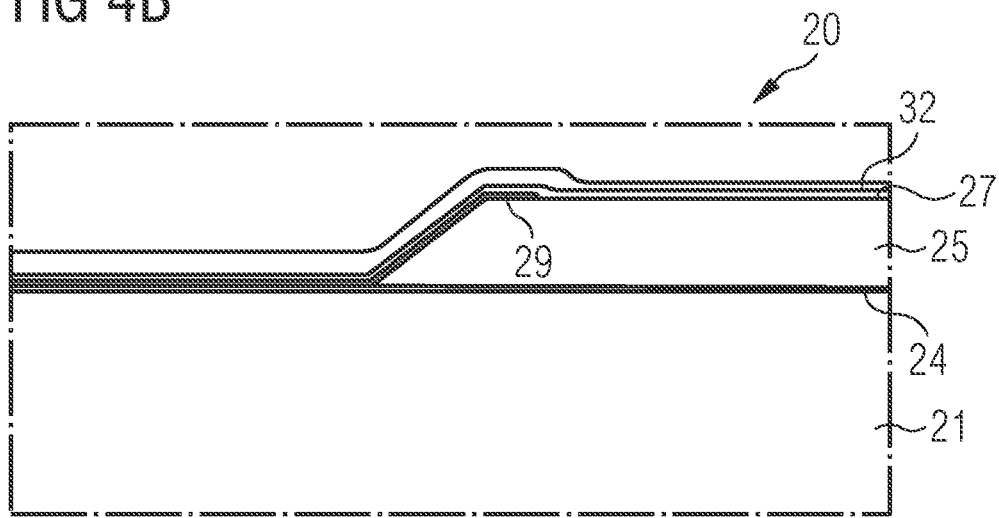

In FIG. 4B, a section of the cross-section shown in FIG. 4A is shown. Thereby it is shown that the third contact layer 29 comprises a greater thickness along the growth direction R than the second contact layer 27. Since the thickness of the second contact layer 27 may be small, the absorption of radiation from the active region 23 in the second contact layer 27 may be reduced, thereby increasing the brightness of the optoelectronic semiconductor chip 20.

In connection with FIGS. 5A, 5B, 5C, 5D, and 5E, an exemplary embodiment of the method for producing the optoelectronic semiconductor chip 20 is described. The steps described may be carried out in the order indicated.

Figure 5A:
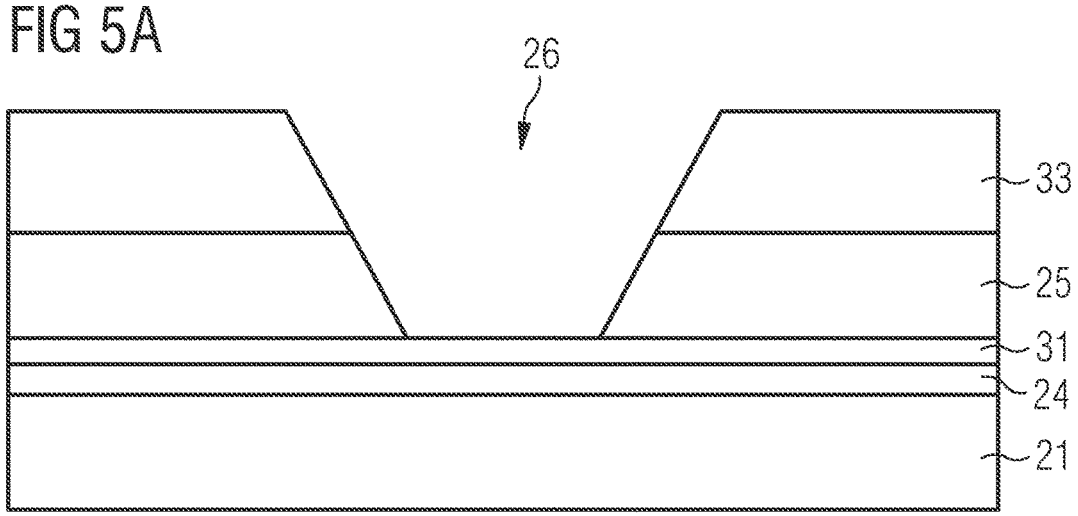

FIG. 5A shows a schematic cross-section. In a first step of the method, the first region 21 is provided on the second region 22. A first contact layer 24 is applied on the first region 21. An etch stop layer 31 is applied on the first contact layer 24. The insulating layer 25 is applied on the etch stop layer 31. A mask 33 is applied on the insulating layer 25 to etch the first openings 26. In the regions in which the mask 33 is not arranged, the insulating layer 25 is etched. In this process, the etch stop layer 31 acts as an etch stop layer 31 for the insulating layer 25, so that the insulating layer 25 is completely removed up to the etch stop layer 31. As a result, the first openings 26 are formed.

Figure 5B:
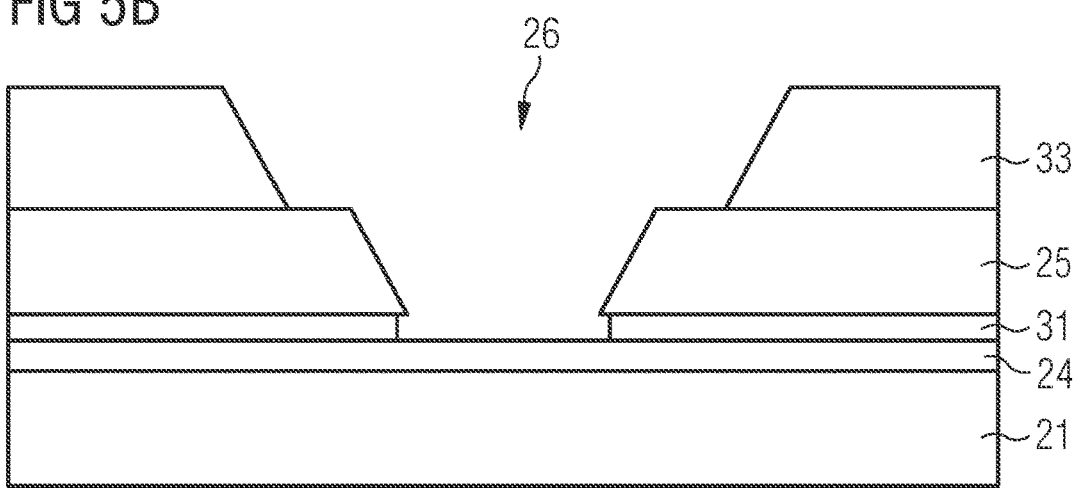

In FIG. 5B, it is shown that in a next step, the mask 33 around the first opening 26 is removed in places. This can be done by processing the mask 33 with an oxygen plasma. In addition, the etch stop layer 31 in the region of the first opening 26 is removed by wet chemical etching.

Figure 5C:
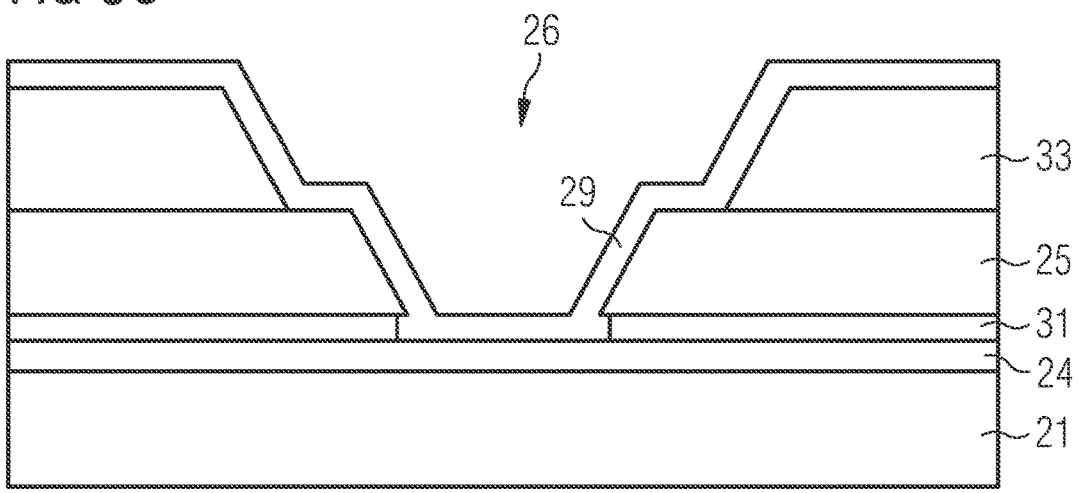

FIG. 5C shows that in a next step, the third contact layer 29 is applied on the mask 33, the insulating layer 25 and on the first opening 26.

Figure 5D:
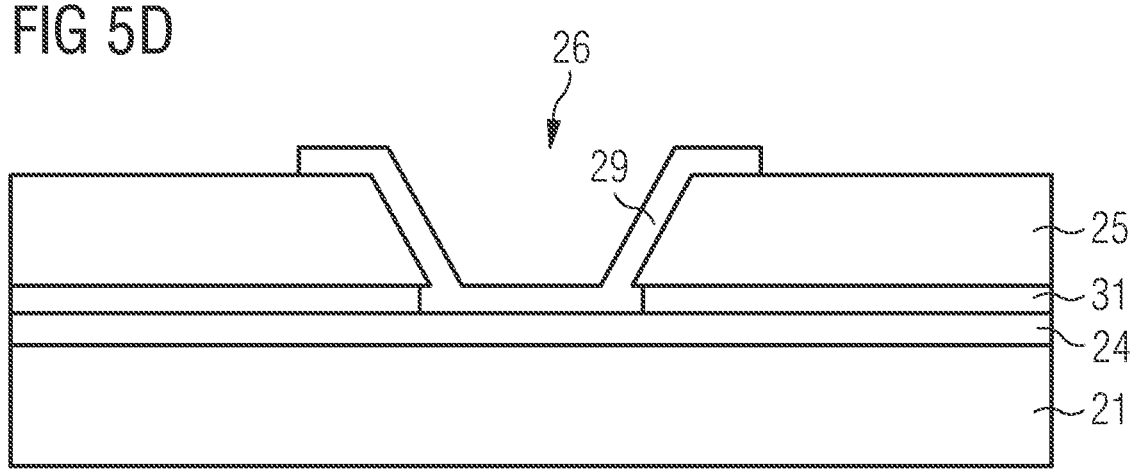

In FIG. 5D it is shown that in a next step the mask 33 is removed.

Figure 5E:
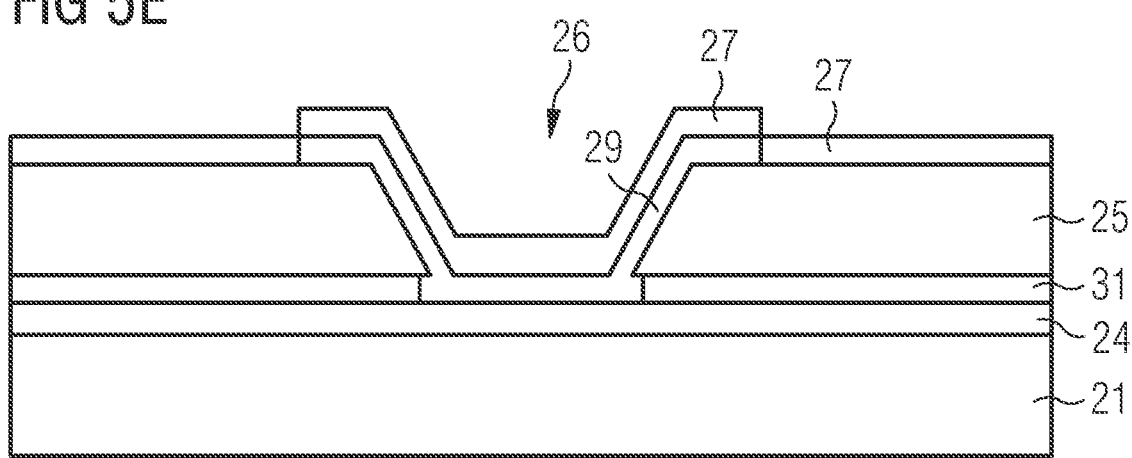

In FIG. 5E it is shown that in a next step the second contact layer 27 is applied to the insulating layer 25 and to the third contact layer 29 and thus also to the first opening 26. Subsequently, the second openings 28 can be formed in the second contact layer 27 by etching.

The features and exemplary embodiments described in connection with the figures may be combined with each other in accordance with further exemplary embodiments, although not all combinations are explicitly described. Furthermore, the exemplary embodiments described in connection with the figures may alternatively or additionally comprise further features as described in the general part.

This patent application claims the priority of German patent application 102019113119.7, the disclosure content of which is hereby incorporated by reference.

The invention is not limited to the exemplary embodiments by the description thereof. Rather, the invention encompasses any new feature as well as any combination of features, which in particular includes any combination of features in the patent claims, even if that feature or combination itself is not explicitly specified in the patent claims or exemplary embodiments.

LIST OF REFERENCE SIGNS

20: optoelectronic semiconductor chip
21: first region
22: second region
23: active region
24: first contact layer
25: insulating layer
26: first opening
27: second contact layer
28: second opening
29: third contact layer
30: upper side
31: etch stop layer
32: passivation layer
33: mask
34: first contact
35: second contact
36: contact bridge
R: growth direction
x: lateral direction

The invention claimed is:

1. An optoelectronic semiconductor chip with:
a first region doped with a first dopant,
a second region doped with a second dopant,
an active region between the first region and the second region,
a first contact layer comprising an electrically conductive material and covering the first region,
an insulating layer covering the first contact layer and comprising first openings, and
a second contact layer comprising an electrically conductive material and covering the insulating layer and the first openings, wherein:
the first openings completely penetrate the insulating layer,
the second contact layer comprises second openings and/or a third contact layer comprising an electrically conductive material is arranged in the first openings in each case between the second contact layer and the insulating layer;
the first contact layer comprises a transparent conductive oxide;
the second contact layer is in direct contact with the insulating layer; and
wherein one first opening is arranged in a lateral direction between two second openings, respectively.

2. The optoelectronic semiconductor chip according to claim 1, wherein each second opening of the second openings completely penetrates the second contact layer.

3. The optoelectronic semiconductor chip according to claim 1, wherein the second contact layer and/or the third contact layer comprise a transparent conductive oxide.

4. The optoelectronic semiconductor chip according to claim 1, wherein the first and second contact layers comprise the same material.

5. The optoelectronic semiconductor chip according to claim 1, wherein the first, the second and the third contact layers comprise the same material.

6. The optoelectronic semiconductor chip according to claim 1, wherein the third contact layer completely covers each of the first openings.

7. The optoelectronic semiconductor chip according to claim 1, wherein the third contact layer covers in places an upper side of the insulating layer facing away from the first region.

8. The optoelectronic semiconductor chip according to claim 1, wherein the third contact layer is in direct contact with the first contact layer in the first openings.

9. The optoelectronic semiconductor chip according to claim 1, wherein at least two of the first openings are arranged along a lateral direction at lattice points of a one-dimensional lattice.

10. The optoelectronic semiconductor chip according to claim 1, wherein at least two of the second openings are arranged along a lateral direction at lattice points of a one-dimensional lattice.

11. The optoelectronic semiconductor chip according to claim 1, wherein the first dopant is a p-type dopant and the second dopant is an n-type dopant.

12. The optoelectronic semiconductor chip according to claim 1, wherein the second contact layer comprises a layer thickness of at most 90 nm along a growth direction perpendicular to a main extension plane of the first region.

13. The optoelectronic semiconductor chip according to claim 1, wherein the third contact layer comprises a layer thickness of at least 50 nm along a growth direction perpendicular to a main extension plane of the first region.

14. A method for producing an optoelectronic semiconductor chip, wherein the method comprises:
providing a first region on a second region, wherein the first region is doped with a first dopant and the second region is doped with a second dopant and an active region is arranged between the first region and the second region,
applying a first contact layer on the first region, wherein the first contact layer comprises an electrically conductive material,
applying an insulating layer,
etching first openings in the insulating layer, wherein the first openings completely penetrate the insulating layer, applying a second contact layer on the insulating layer and the first openings, wherein the second contact layer comprises an electrically conductive material, and etching second openings in the second contact layer and/or applying a third contact layer in the first openings before applying the second contact layer, wherein the third contact layer comprises an electrically conductive material;

wherein the second contact layer is in direct contact with the insulating layer and wherein one first opening is arranged in a lateral direction between two second openings, respectively.

15. The method according to claim 14, wherein an etch stop layer is applied on the first contact layer.

16. An optoelectronic semiconductor chip with:
a first region doped with a first dopant,
a second region doped with a second dopant,
an active region between the first region and the second region,
a first contact layer comprising an electrically conductive material and covering the first region,
an insulating layer covering the first contact layer and comprising first openings, and
a second contact layer comprising an electrically conductive material and covering the insulating layer and the first openings, wherein:
the first openings completely penetrate the insulating layer,
a third contact layer comprising an electrically conductive material is arranged in the first openings in each case between the second contact layer and the insulating layer;
the first contact layer comprises a transparent conductive oxide; and
the second contact layer is in direct contact with the insulating layer.

* * * * *